United States Patent
Sharma et al.

(10) Patent No.: US 7,733,174 B2
(45) Date of Patent: Jun. 8, 2010

(54) FEEDBACK CONTROLLED POWER LIMITING FOR SIGNAL AMPLIFIERS

(75) Inventors: Arun Kumar Sharma, Dallas, TX (US); Ryan Erik Lind, Knoxville, TN (US); Ronnie A. Bean, Brandon, MS (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 12/253,764

(22) Filed: Oct. 17, 2008

(65) Prior Publication Data
US 2010/0097145 A1  Apr. 22, 2010

(51) Int. Cl.
*H03F 1/36* (2006.01)
(52) U.S. Cl. ........................ 330/110; 330/311
(58) Field of Classification Search .............. 330/110, 330/252, 311, 69
See application file for complete search history.

(56) References Cited

U.S. PATENT DOCUMENTS

| | | | |
|---|---|---|---|
| 3,737,678 A | 6/1973 | Dolby et al. | |
| 3,818,244 A | 6/1974 | Dolby et al. | |
| 5,166,635 A * | 11/1992 | Shih | 330/253 |
| 5,737,432 A | 4/1998 | Werrbach | |
| 6,160,441 A * | 12/2000 | Stratakos et al. | 327/540 |
| 7,155,020 B2 | 12/2006 | Behringer et al. | |
| 7,312,662 B1 * | 12/2007 | Roo et al. | 330/311 |
| 7,443,245 B2 * | 10/2008 | Tsurumaki et al. | 330/285 |

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

An apparatus is provided. The apparatus includes an amplifier, differential amplifiers, and FETs. The amplifier has an intermediate node and an output node, and the amplifier is adapted to receive an audio signal. Each differential amplifier amplifies the difference between an output voltage from the output node with a reference voltages. The FETs are coupled in series with one another between a first and a second voltage, and each FET receives an output from at least one of the differential amplifiers. Additionally, the intermediate node is coupled to a node between at least two FETs.

15 Claims, 4 Drawing Sheets

FEEDBACK CONTROLLED POWER LIMITING FOR SIGNAL AMPLIFIERS

TECHNICAL FIELD

This invention relates generally to output voltage and power limiting of signal amplifiers, and more specifically to feedback controlled limiting of the output power level of an audio amplifier used for driving headphones.

BACKGROUND

Audio amplifiers are a class of signal amplifiers used in a wide variety of electronic equipment, including stereo audio systems, televisions, personal media players, and cellular phones. Some of these amplifiers drive speakers, such as those in a stereo audio system or television, while others typically drive headphones, such as those used with personal media players and cellular phones.

In many cases it is desirable to limit the peak or average audio output level delivered to headphones, to preclude hearing loss from excessive sound pressure levels. Many devices driving headphones, such as compact disc players, MP3 players, and portable DVD players incorporate circuitry to limit audio output levels delivered to headphones.

One known approach is the use of an automatic gain control (AGC), which compares the peak or average audio level to a threshold, and decreases the amplifier gain so as to reduce output level for some time period after this threshold is exceeded. Such circuits typically have time constants with relatively fast attack and much slower decay to reduce audible effects of the AGC operation. To minimize the undesired modulation of the audio level by the AGC, sometimes referred to as "pumping", the time constant for decay is often seconds long. This long time constant often leads to an undesirable characteristic wherein a brief sound above the threshold level, for example a loud cymbal, causes a rapid reduction in output level, not only of the brief sound which exceeded threshold but of all sound for the next several seconds. Following the over-threshold audio, if the audio levels remain below threshold sound level, the amplitude of the audio will gradually increase, at a rate set by the decay time constant, until gain is again at its nominal level. This gain change during music leads to undesired distortion of the dynamic range of the audio, and also may cause soft music following a loud musical peak to be so low in level as to be difficult to hear.

Another known approach to limiting the output level of an audio amplifier is the use of clipping of the audio signal on a cycle by cycle basis. A clipper simply replaces any portion of an audio waveform which otherwise would be above a threshold level with a constant voltage at the threshold level, until the waveform voltage again falls below threshold. There is typically no intentional gain change caused by such clipping, and the time constant for clipping is typically much faster than the period of a single cycle of audio, even at its highest frequencies.

Clipping therefore avoids the dynamic range modulation artifacts or "pumping" associated with an AGC, and causes little or no change in audio levels which stay below the clipping level. However, clipping of those portions of the waveform which otherwise would have exceeded the threshold level causes significant increases in harmonic distortion, due to the introduction of abrupt discontinuities in the audio waveform at the start and end of clipping for each cycle.

Some examples of prior art devices can be seen in U.S. Pat. Nos. 3,737,678; 3,818,244; 5,737,432; and 7,155,020.

An apparatus and method for limiting the output level of an audio amplifier, which causes less dynamic range modulation than an AGC and less harmonic distortion than known clipping circuits, is therefore desirable, and is an object of the present invention.

SUMMARY

A preferred embodiment of the present invention, accordingly, provides a method and apparatus for reducing the output level of a signal amplifier, in a gradual and controlled manner, during that portion of a cycle during which the amplifier output voltage would otherwise exceed a threshold level, while creating less harmonic distortion than would be caused by waveform clipping.

In a preferred embodiment of the invention described in greater detail below, the instantaneous voltage level at the signal amplifier output during a cycle is compared in a difference or differential amplifier to an upper threshold. If the voltage is below this upper threshold, the output of the differential amplifier, which is coupled to the gate of a FET (field effect transistor), provides a low gate-source voltage and keeps the FET in a low conductance state. The drain of the FET is coupled to the input of the signal amplifier, and the source of the FET is coupled to a stable voltage below the upper threshold, such as a voltage Vminus. With the FET in a low conductance state, the output of the signal amplifier is essentially unmodified. As the output voltage exceeds the threshold, however, the gate to source voltage of the FET is gradually modified responsive to the amount the output voltage exceeds threshold, increasing the conductance of the FET and thus reducing the signal level at the input of the signal amplifier. As the signal amplifier output voltage decreases and again falls below threshold, the FET conductance is correspondingly decreased until it again is very low during that portion of the cycle below threshold. A similar lower threshold comparator controls a second FET, reducing the negative going signal excursion during that fraction of the signal period below the lower threshold, by increasing the conductance of the second FET having its source coupled to a voltage above the lower threshold, such as voltage Vplus, and its drain coupled to the input of the signal amplifier. In this manner, the output signal is unaffected if it stays within the upper and lower threshold boundaries, and those portions of the waveform outside the threshold levels are modified in a gradual manner to reduce signal excursion outside of the threshold, while limiting harmonic distortion.

In accordance with another preferred embodiment of the present invention, an apparatus is provided. The apparatus comprises an amplifier having an intermediate node and an output node, wherein the amplifier is adapted to receive an audio signal; a plurality of differential amplifiers, wherein each differential amplifier amplifies the difference a output voltage from the output node with at least one of a plurality of reference voltages; and a plurality of FETs coupled in series with one another between a first and a second voltage, wherein each FET receives an output from at least one of the differential amplifiers, and wherein the intermediate node is coupled to at least one node between at least two FETs.

In accordance with another preferred embodiment of the present invention, the plurality of reference voltages are supplied by a voltage source.

In accordance with another preferred embodiment of the present invention, the voltage source further comprises a voltage divider; a plurality of switches, wherein each switch is coupled to at least one node of the voltage divider; and a plurality of second amplifiers, wherein each amplifier is coupled to at least one switch and at least one differential amplifier.

In accordance with another preferred embodiment of the present invention, the at least one of the second amplifiers is a follower.

In accordance with another preferred embodiment of the present invention, each differential amplifier comprises a plurality of FETs and a current source.

In accordance with another preferred embodiment of the present invention, the first and second voltages are raising and lowering voltages.

In accordance with another preferred embodiment of the present invention, the amplifier further comprises a preamplifier that receives the audio signal; and a postamplifier that is coupled to the preamplifier at the intermediate node and outputs the output voltage to the output node.

In accordance with another preferred embodiment of the present invention, an apparatus is provided. The apparatus comprises an amplifier having an intermediate node and an output node, wherein the amplifier is adapted to receive an audio signal; a first differential amplifier that amplifies the difference between the voltage from the output node with a first reference voltage; a second differential amplifier that amplifies the difference between the voltage from the output node with a second reference voltage; a first FET coupled to a first voltage, wherein the first FET receives an output from the first differential amplifier at its gate; a second FET coupled to the first FET and a second voltage, wherein the second FET receives an output from the second differential amplifier at its gate, and wherein the intermediate node is coupled to the node between the first FET and the second FET.

In accordance with another preferred embodiment of the present invention, the first and second reference voltages are supplied by a voltage source.

In accordance with another preferred embodiment of the present invention, the voltage source further comprises a voltage divider; a plurality of switches, wherein each switch is coupled to at least one node of the voltage divider; and a second amplifier coupled to each of the switches and to second differential amplifier; and a third amplifier coupled to the second amplifier, the first differential amplifier, and the second differential amplifier.

In accordance with another preferred embodiment of the present invention, a method of reducing the gain of an amplifier when its output voltage is above an upper limit or below a lower limit is provided. The method comprises measuring the output voltage; comparing the output voltage to a first reference voltage; increasing the conductance between an input of the amplifier and a lowering voltage if the output voltage is greater than the first reference voltage; comparing the output voltage to a second reference voltage; and increasing the conductance between the input of the amplifier and a raising voltage if the output voltage is less than the second reference voltage.

In accordance with another preferred embodiment of the present invention, the step of increasing the conductance between an input of the amplifier and a lowering voltage if the output voltage is greater than the first reference voltage further comprises increasing the conductance between an input of the amplifier and a lowering voltage substantially proportional to the difference between the output voltage and the first reference voltage if the output voltage is greater than the first reference voltage.

In accordance with another preferred embodiment of the present invention, the step of increasing the conductance between the input of the amplifier and a raising voltage if the output voltage is less than the second reference voltage further comprises increasing the conductance between the input of the amplifier and a raising voltage substantially proportional to the difference between the output voltage and the second reference voltage if the output voltage is less than the second reference voltage A significant advantage of the described embodiments is that there is little or no audible pumping such as that typically introduced by an audio AGC, and the harmonic distortion caused by the described embodiments is typically significantly less than that introduced by cycle-by-cycle clipping. A further advantage is that no time constant for attack or decay is typically needed, eliminating difficult to integrate components such as large value resistors and capacitors often associated with an audio AGC. A further advantage is the ability to easily change the threshold levels to change the output level at which gain reduction occurs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
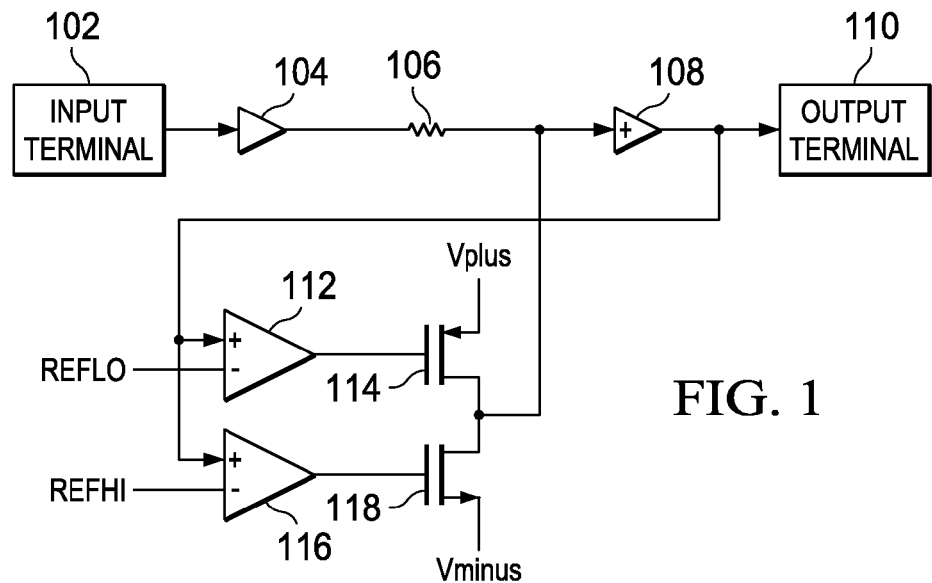
FIG. 1 is a block diagram of a circuit in accordance with a preferred embodiment of the present invention which reduces the output of a signal amplifier when a portion of a cycle goes above or below preset thresholds.

Refer now to the drawings wherein depicted elements are, for the sake of clarity, not necessarily shown to scale and wherein like or similar elements are designated by the same reference numeral through the several views.

In FIG. 1, an amplifier with feedback controlled power limiting comprises Input Terminal 102, first stage Signal Amplifier or preamplifier 104, Resistor 106, second stage Signal Amplifier or postamplifier 108, Output Terminal 110, Differential Amplifier 112, FET 114, Differential Amplifier 116, and FET 118. Input Terminal 102 is coupled to the input of Signal Amplifier 104, whose output is coupled to a first terminal of Resistor 106. The second terminal of Resistor 106 is coupled to the input of Signal Amplifier 108, and the output of Signal Amplifier 108 is coupled to Output Terminal 110 at an intermediate node, the non-inverting input of Differential Amplifier 112, and the non-inverting input of Differential Amplifier 116. The inverting input of Differential Amplifier 112 is coupled to voltage source or reference voltage REFLO, and the inverting input of Differential Amplifier 116 is coupled to voltage source or reference voltage REFHI. The output of Differential Amplifier 112 is coupled to the gate of FET 114, which has its source coupled to voltage source or raising voltage Vplus and its drain coupled to the drain of FET 118 and the input of Signal Amplifier 108. The output of Differential Amplifier 116 is coupled to the gate of FET 118, which has its source coupled to voltage source or lowering voltage Vminus and its drain coupled to the drain of FET 114 and the input of Signal Amplifier 108.

In operation, a signal is applied to the Input Terminal 102 and hence to the input of Signal Amplifier 104. The output of Signal Amplifier 104 is substantially equal to the input signal times the gain of Signal Amplifier 104. This signal at the output of Signal Amplifier 104 is coupled to the input of Signal Amplifier 108 through a series resistance Resistor 106, which typically is the output impedance of the Signal Amplifier 104 but is shown as a separate resistor for clarity. Because the input resistance of Signal Amplifier 108 is typically much higher than the resistance of Resistor 106, if there is little or no conductance in either FET 114 or FET 118, the input of Signal Amplifier 108 is substantially equal to the output of Signal Amplifier 104. The signal is amplified further in the second stage Signal Amplifier 108, and is coupled to Output Terminal 110 and to the inputs of Differential Amplifier 112 and Differential Amplifier 116. If the signal Va at Output Terminal 110 is below voltage REFHI, the output of Differential Amplifier 116 is substantially equal to Vminus, the negative supply voltage for Differential Amplifier 116 and Differential Amplifier 112. The gate to source voltage Vgs for FET 118 is therefore near zero, and FET 118 exhibits low conductance. As the signal Va begins to exceed REFHI, the output voltage of Differential Amplifier 116 increases, thereby increasing the Vgs of FET 118 and increasing its conductance. As the conductance increases, signal current at the input of Signal Amplifier 108 is shunted through FET 118 to supply Vminus, decreasing the voltage at the input of Signal Amplifier 108. The abruptness or softness of the increase in conductance depends on the gate-source threshold voltage characteristic of FET 118 and the gain of Differential Amplifier 116, and therefore may be tailored to the application by choice of these parameters.

In a similar manner, if the signal Va at Output Terminal 110 is above reference voltage REFLO, the output of Differential Amplifier 112 is substantially equal to Vplus, the positive supply voltage for Differential Amplifier 116 and Differential Amplifier 112. The gate to source voltage Vgs for FET 114 is therefore near zero, and FET 114 exhibits low conductance. As the signal Va begins to go below REFLO, the output voltage of Differential Amplifier 112 decreases, thereby increasing the Vgs of FET 114 and increasing its conductance. As the conductance increases, signal current at the input of Signal Amplifier 108 is shunted through FET 114 to supply Vplus, increasing the voltage at the input of Signal Amplifier 108. As described above, the abruptness or softness of the increase in conductance depends on the threshold characteristic of FET 114 and the gain of Differential Amplifier 112.

The gain reduction is near zero as long as the output signal Va stays above REFLO and below REFHI, and that as Va goes outside either bound, on a cycle by cycle basis, the input voltage to the second stage Signal Amplifier 108 is modified so as to move the voltage Va back toward the appropriate threshold. Unlike hard clipping, the gain reduction applied is a function of the difference between Va and the threshold REFLO or REFHI. Gain reduction thus is gradually increased as Va goes outside either bound, creating significantly less harmonic distortion than would occur with hard clipping.

Figure 2:
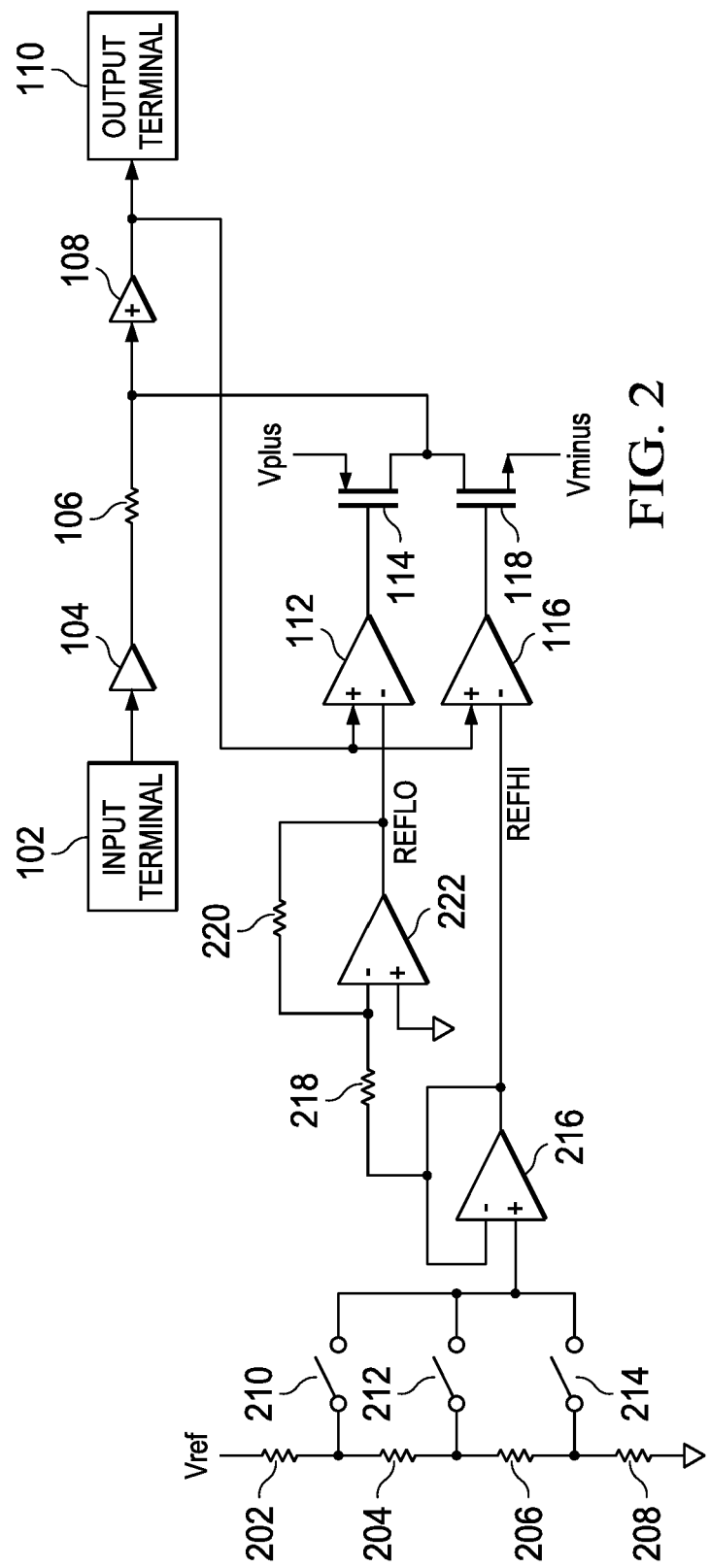
FIG. 2 is a block diagram of the circuit of FIG. 1 with added circuitry to select from a multiplicity of threshold values.

In FIG. 2, additional circuitry is shown that enables selection of the values of REFLO and REFHI, as applied to the circuit of FIG. 1, from a plurality of values. This additional circuitry comprises resistors 202, 204, 206, 208, switches 210, 212, 214, Differential Amplifier 216, Differential Amplifier 222, and resistors 218 and 220. A first terminal of Resistor 202 is coupled to voltage source Vref, a second terminal of Resistor 202 is coupled to a first terminal of Resistor 204 and to a first terminal of switch 210, a second terminal of Resistor 204 is coupled to a first terminal of Resistor 206 and a first terminal of switch 212, a second terminal of Resistor 206 is coupled to a first terminal of Resistor 208 and a first terminal of switch 214, and a second terminal of Resistor 208 is coupled to ground. A second terminal of switch 210 is coupled to a second terminal of switch 212, a second terminal of switch 214, and the non-inverting input of Differential Amplifier 216. The inverting input of Differential Amplifier 216 is coupled to the output of Differential Amplifier 216, a first terminal of Resistor 218, and the inverting input of Differential Amplifier 116, which is the REFHI node of FIG. 1. A second terminal of Resistor 218 is coupled to a first terminal of Resistor 220 and to the inverting input of Differential Amplifier 222. A second terminal of Resistor 220 is coupled to the output terminal of Differential Amplifier 222. The non-inverting input of Differential Amplifier 222 is coupled to ground, and the output of Differential Amplifier 222 is coupled to the inverting input of Differential Amplifier 112, which is the REFLO node of FIG. 1. The remainder of the circuitry of FIG. 2 is configured and operates as described for FIG. 1.

In operation, the resistive ladder or divider comprising Resistors 202, 204, 206, 208 is coupled between voltage source Vref and ground, operable to provide a plurality of voltages between Vref and ground. Switches 210, 212, 214 are operable to select one voltage from this plurality of ladder voltages, and couple it to the non-inverting input of Differential Amplifier 216, which is configured as a voltage follower. The selected voltage thus appears at the output of Differential Amplifier 216, and is REFHI. Resistors 218 and 220, in conjunction with Differential Amplifier 222, provide a unity-gain inverting amplifier with the voltage REFHI as an input, operable to provide an output voltage REFLO which is substantially equal in magnitude to voltage REFHI, but negative. This embodiment described, thus, operates to allow selection of a plurality of threshold voltages REFHI and REFLO, and further provides that the magnitude of voltage REFLO is substantially equal to that of voltage REFHI, as is desired for symmetrical gain reduction of the positive and negative half-cycles of an audio waveform. Given selected REFHI and REFLO voltages, the balance of the circuit operates as described for FIG. 1.

Figure 3:
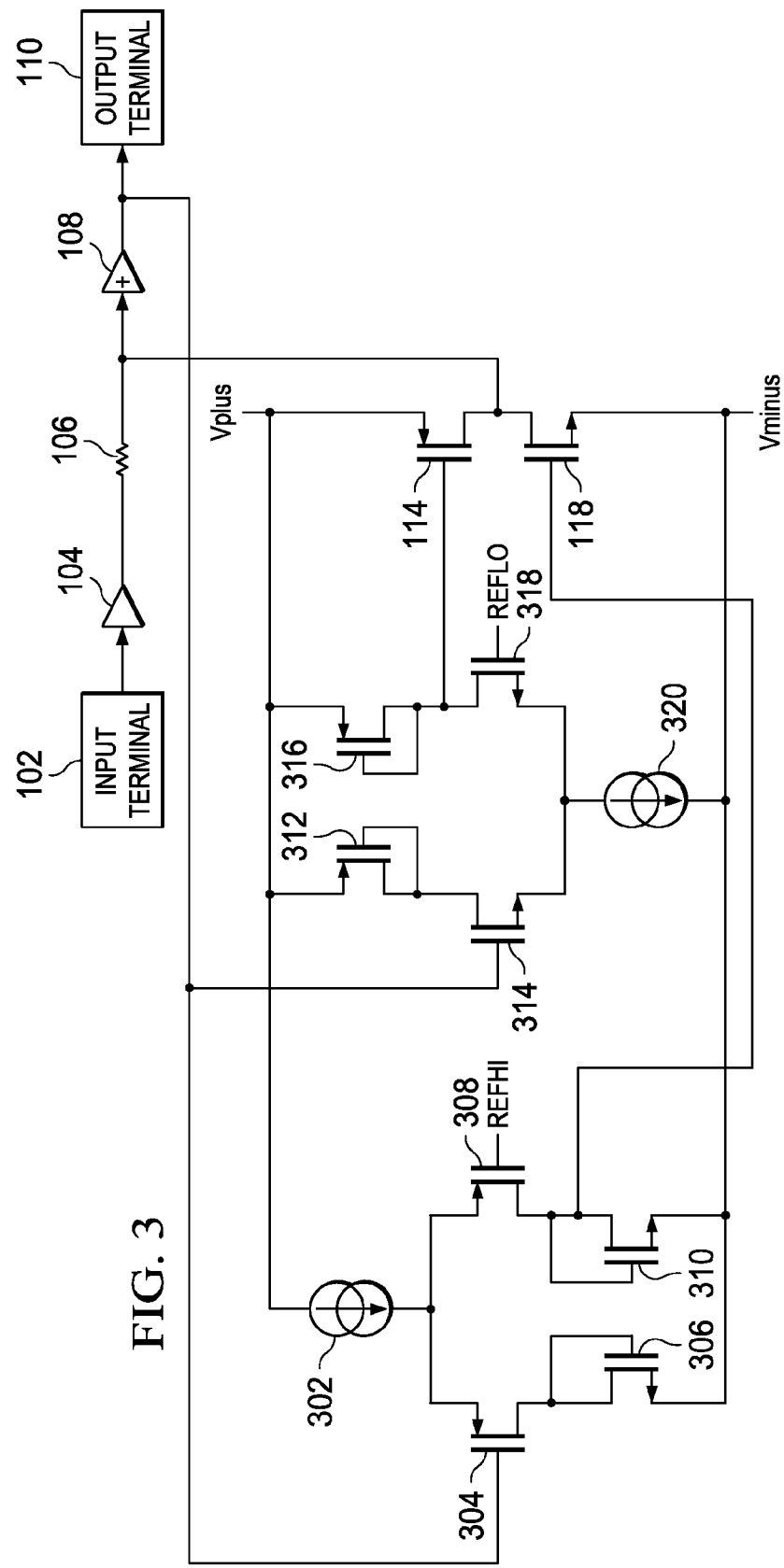
FIG. 3 is a block diagram in accordance with a preferred embodiment of the present invention based on FIG. 1 and using a differential amplifier to amplify the difference between the signal voltage Va and each threshold voltage.

In FIG. 3, Differential Amplifier 112 and Differential Amplifier 116 of FIG. 1 are replaced by Differential Amplifiers comprising FETs 304, 306, 308, 310, 312, 314, 316, and 318, as well as current sources 302 and 320. A first terminal of current source 302 is coupled to supply terminal Vplus, and the second terminal of this current source is coupled to the source of FET 304 and the source of FET 308. The drain of FET 304 is coupled to the gate of FET 306 and the drain of FET 306, while the drain of FET 308 is coupled to the gate of FET 310 and the drain of FET 310. The sources of both FET 306 and FET 310 are coupled to supply terminal Vminus. The gate of FET 304 is coupled to the output terminal of Signal Amplifier 108 of FIG. 1, and the gate of FET 308 is coupled to voltage source REFHI. The drain of FET 310 is coupled to the gate of FET 118 of FIG. 1.

Similarly, a first terminal of current source 320 is coupled to supply terminal Vminus, and the second terminal of this current source is coupled to the source of FET 314 and the source of FET 318. The drain of FET 314 is coupled to the gate of FET 312 and the drain of FET 312, while the drain of FET 318 is coupled to the gate of FET 316 and the drain of FET 316. The sources of both FET 312 and FET 316 are coupled to supply terminal Vplus. The gate of FET 314 is coupled to the output terminal of Signal Amplifier 108 of FIG. 1, and the gate of FET 318 is coupled to voltage source REFLO. The drain of FET 316 is coupled to the gate of FET 114 of FIG. 1. The balance of the circuitry of FIG. 3 is the same as that of FIG. 1.

In operation, current source 302 provides the tail current for the differential pair FET 304 and FET 308. Because of the series connection of FET 304 and FET 306, the source current in each is substantially the same. Similarly, the source current in FET 308 and FET 310 is substantially the same. The total source current flowing in both legs of the differential amplifier is substantially equal to the tail current. FET 306 acts as an active load for FET 304, and FET 310 acts as an active load for FET 308. When the voltages on the gates of FET 304 and FET 308 are substantially the same, substantially equal source currents flow in all four FETs. As the voltage at the gate of FET 304 increases above REFHI, more current flows in FET 308 and less in FET 304, thus increasing the voltage at the drain of FET 308. As the voltage at the gate of FET 304 goes below REFHI, more current flows in FET 304 and less in FET 308, thus decreasing the voltage at the drain of FET 308.

Similarly, current source 320 provides the tail current for the differential pair FET 314 and FET 318. Because of the series connection of FET 314 and FET 312, the source current in each is substantially the same. Similarly, the source current in FET 318 and FET 316 is substantially the same. The total source current flowing in both legs of the differential amplifier is substantially equal to the tail current. FET 312 acts as an active load for FET 314, and FET 316 acts as an active load for FET 318. When the voltages on the gates of FET 314 and FET 318 are substantially the same, substantially equal source currents flow in all four FETs. As the voltage at the gate of FET 314 goes below REFLO, more current flows in FET 318 and less in FET 314, thus decreasing the voltage at the drain of FET 318. As the voltage at the gate of FET 314 goes above REFLO, more current flows in FET 314 and less in FET 318, thus increasing the voltage at the drain of FET 318.

The gates of FET 304, FET 308, FET 314, and FET 318 are functionally equivalent to the non-inverting input of Differential Amplifier 116, the inverting input of Differential Amplifier 116, the non-inverting input of Differential Amplifier 112, and the inverting input of Differential Amplifier 112, respectively, of FIG. 1. The drains of FET 308 and FET 318 are functionally equivalent to the outputs of Differential Amplifier 116 and Differential Amplifier 112, respectively. The balance of the circuitry operates as described for FIG. 1.

Figure 4:
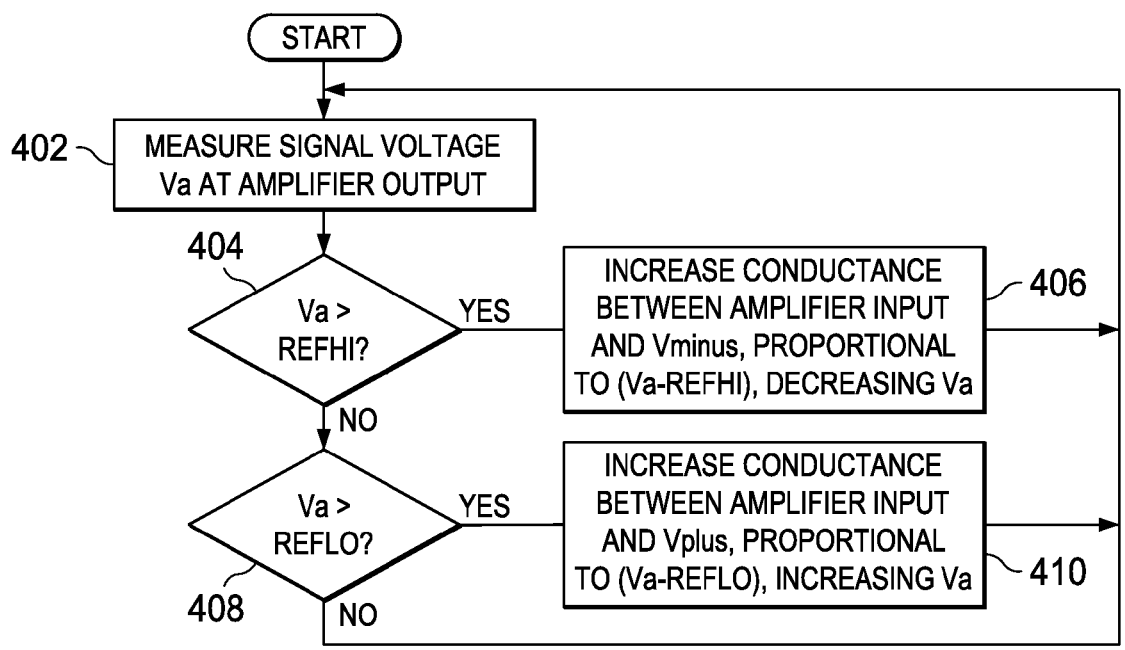
FIG. 4 is a flow chart of a method for reducing gain of a signal amplifier when the output voltage Va is outside set threshold limits.

In FIG. 4, a method of controlling the output level of a signal amplifier is described. At step 402, the instantaneous amplifier output signal voltage Va is measured. At step 404, this measured voltage Va is compared to a predetermined threshold voltage REFHI. If Va>REFHI, then at step 406 the conductance between the signal amplifier input terminal and Vminus is increased generally or substantially in proportion to the difference (Va−REFHI), after which process flow reverts to step 402. If Va as measured is not greater than REFHI, at step 408 Va is compared to a predetermined threshold REFLO. If Va<REFLO, then at step 410 the conductance between the signal amplifier input terminal and Vplus is increased generally or substantially in proportion to the difference (REFLO−Va), after which process flow reverts to step 402. If at step 408 Va is not less than REFLO, then process flow reverts to step 402. In this manner, when the voltage Va is above REFHI it is modified by increasing conductance between the amplifier input and a lower voltage Vminus, thus decreasing Va; when the voltage Va is below REFLO it is modified by increasing conductance between the amplifier input and a higher voltage Vplus, thus increasing Va.

Figure 5:
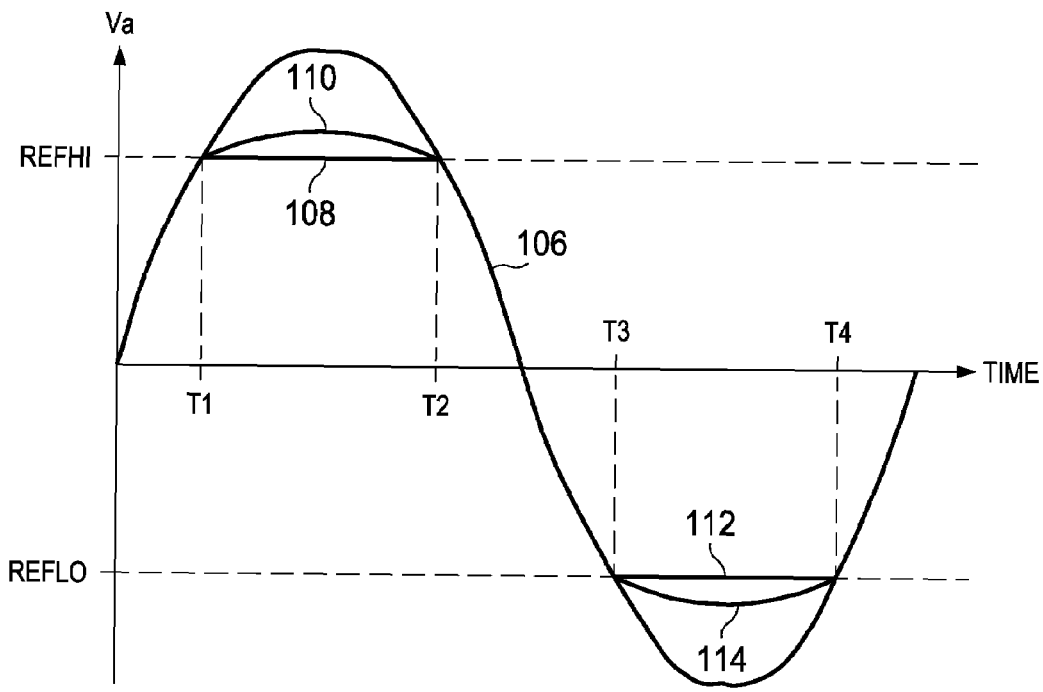
FIG. 5 is a graph of one cycle of a signal waveform, comparing the effect on the waveform of clipping and of gain reduction.

In FIG. 5, a graph of one cycle of sinusoidal signal voltage Va versus time shows the effect of clipping compared to the effect on the signal waveform of the embodiments described herein. The waveform 506 represents the output signal waveform without clipping or gain reduction. During the positive half-cycle, its voltage Va exceeds the value REFHI between times T1 and T2. During the negative half-cycle, the negative voltage −Va of waveform 506 exceeds the value REFLO between times T3 and T4. Waveform segments 508 and 512 show the effect on the waveform 506 of clipping to the level REFHI during the positive half-cycle, and to the level REFLO during the negative half-cycle, respectively. The abrupt transitions in signal voltage at T1, T2, T3 and T4 introduce undesired harmonics of the waveform, increasing harmonic distortion. The waveform segments 510 and 514 show the effect of the embodiments described herein on the positive and negative going half-cycles of waveform 506, respectively. Note that the onset of gain reduction at time T1 is much less abrupt than that of the clipped waveform segment 508, and that between times T1 and T2 the shape of the waveform segment retains the general shape of the unattenuated waveform 506, with a smaller amplitude change over the time period than waveform 506. During the negative half-cycle, transitions between times T3 and T4 are similarly much less abrupt than they would be with clipping. This combination of less-abrupt gain reduction as the input exceeds REFHI or REFLO provides smoother transitions between times of gain reduction and times of little or no gain reduction, leading to reduced harmonic distortion when compared with the clipped waveform segments 508 and 512.

Figure 6:
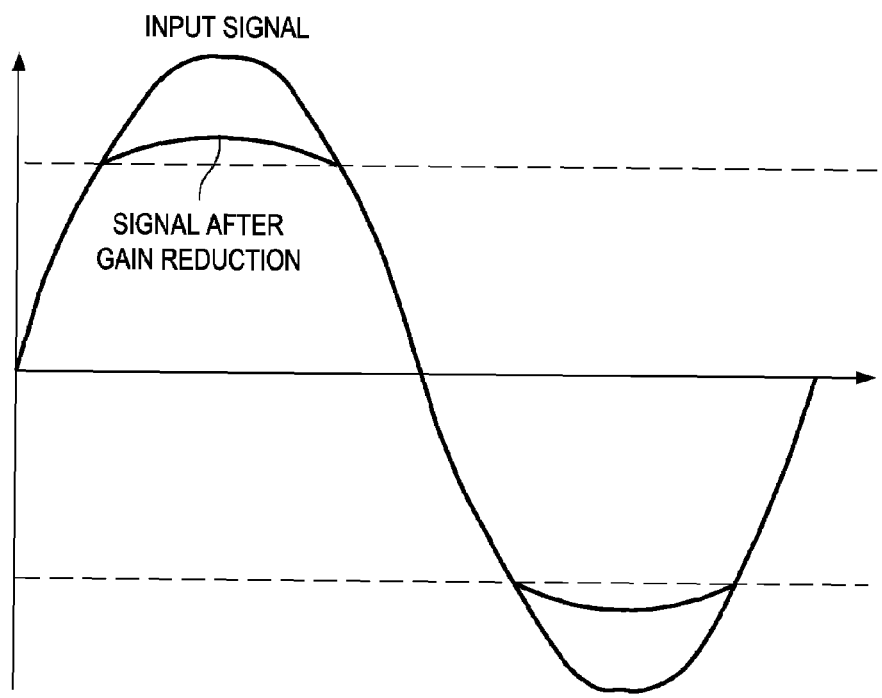
FIG. 6 is an oscillograph of one cycle of an actual signal waveform, showing the effect on the waveform of the gain reduction provided by a preferred embodiment of the invention.

In FIG. 6, an oscillograph of the limited output waveform is shown superimposed on the input sinusoidal waveform. The output waveform has smooth transitions between the non-limited portions, which are substantially identical to the input waveform, and the limited portions of the waveform, as described above for FIG. 5.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an amplifier having an intermediate node and an output node, wherein the amplifier is adapted to receive an audio signal;
   a plurality of differential amplifiers, wherein each differential amplifier amplifies the difference between an output voltage from the output node with at least one of a plurality of reference voltages; and
   a plurality of FETs coupled in series with one another between a first and a second voltage, wherein each FET receives an output from at least one of the differential amplifiers, and wherein the intermediate node is coupled to at least one node between at least two FETs.

2. The apparatus of claim 1, wherein the plurality of reference voltages are supplied by a voltage source.

3. The apparatus of claim 2, wherein the voltage source further comprises:
   a voltage divider;
   a plurality of switches, wherein each switch is coupled to at least one node of the voltage divider; and
   a plurality of second amplifiers, wherein each amplifier is coupled to at least one switch and at least one differential amplifier.

4. The apparatus of claim 3, wherein the at least one of the second amplifiers is a follower.

5. The apparatus of claim 1, wherein each differential amplifier comprises a plurality of FETs and a current source.

6. The apparatus of claim 1, wherein the first and second voltages are raising and lowering voltages.

7. The apparatus of claim 1, wherein the amplifier further comprises:
   a preamplifier that receives the audio signal; and
   a postamplifier that is coupled to the preamplifier at the intermediate node and outputs the output voltage to the output node.

8. An apparatus comprising:
   an amplifier having an intermediate node and an output node, wherein the amplifier is adapted to receive an audio signal;
   a first differential amplifier that amplifies the difference between an output voltage from the output node with a first reference voltage;
   a second differential amplifier that amplifies the difference between the output voltage from the output node with a second reference voltage;
   a first FET coupled to a first voltage, wherein the first FET receives an output from the first differential amplifier at its gate;
   a second FET coupled to the first FET and a second voltage, wherein the second FET receives an output from the second differential amplifier at its gate, and wherein the intermediate node is coupled to the node between the first FET and the second FET.

9. The apparatus of claim 8, wherein the first and second reference voltages are supplied by a voltage source.

10. The apparatus of claim 9, wherein the voltage source further comprises:
    a voltage divider;
    a plurality of switches, wherein each switch is coupled to at least one node of the voltage divider; and
    a second amplifier coupled to each of the switches and to second differential amplifier; and
    a third amplifier coupled to the second amplifier, the first differential amplifier, and the second differential amplifier.

11. The apparatus of claim 10, wherein the second amplifier is a follower.

12. The apparatus of claim 8, wherein each differential amplifier comprises a plurality of FETs and a current source.

13. The apparatus of claim 8, wherein the first voltage is a raising voltage.

14. The apparatus of claim 8, wherein the second voltage is a lowering voltage.

15. The apparatus of claim 1, wherein the amplifier further comprises:
    a preamplifier that receives the audio signal; and
    a postamplifier that is coupled to the preamplifier at the intermediate node and outputs the output voltage to the output node.

* * * * *